United States Patent [19]

Smith

[11] Patent Number: 5,430,607
[45] Date of Patent: Jul. 4, 1995

[54] RUGGED MODULAR PORTABLE COMPUTER INCLUDING MODULES HINGED ALONG AN EDGE

[75] Inventor: Stephen W. Smith, South Lyon, Mich.

[73] Assignee: North Atlantic Industries, Inc., Hauppauge, N.Y.

[21] Appl. No.: 999,213

[22] Filed: Dec. 31, 1992

[51] Int. Cl.⁶ .......................... G06F 1/16; H05K 5/06; H05K 7/20; H05K 9/00
[52] U.S. Cl. .................................. 361/683; 361/818; 361/695; 361/697; 361/707
[58] Field of Search .................. 248/632-634, 248/917-923; 312/223.2, 223.3; D14/100, 106; 364/708.1; 360/137; 174/52.3, 35 R, 35 GC; 361/680-687, 694, 695, 697, 707, 709-711, 715, 724, 816-818

[56] References Cited

U.S. PATENT DOCUMENTS

| | | |
|---|---|---|
| 1,940,686 | 12/1933 | Lord . |
| 2,715,152 | 8/1955 | Balzer .................. 174/35 GC X |
| 3,909,504 | 9/1975 | Browne . |
| 4,066,234 | 1/1978 | Nycum .................. 248/633 X |
| 4,294,496 | 10/1981 | Murez .................. 312/223.3 X |
| 4,633,350 | 12/1986 | Hanson . |
| 4,680,674 | 7/1987 | Moore .................. 361/686 |
| 4,683,520 | 7/1987 | Grassens et al. . |
| 4,685,312 | 8/1987 | Lakoski et al. . |
| 4,690,960 | 9/1987 | Yamauchi et al. . |
| 4,705,257 | 11/1987 | Leo et al. . |
| 4,713,714 | 12/1987 | Gatti et al. . |
| 4,719,526 | 1/1988 | Okita et al. . |
| 4,744,006 | 5/1988 | Duffield . |
| 4,749,164 | 6/1988 | Leo et al. . |
| 4,751,872 | 6/1988 | Lawson, Jr. .................. 361/687 X |
| 4,763,869 | 8/1988 | Nakamura et al. . |
| 4,847,602 | 7/1989 | Altland et al. .................. 361/682 |
| 4,889,542 | 12/1989 | Hayes . |
| 4,896,777 | 1/1990 | Lewis . |
| 4,912,580 | 3/1990 | Hanson . |
| 4,916,575 | 4/1990 | Van Asten . |
| 4,937,771 | 6/1990 | Rumps, Jr. et al. . |
| 4,937,806 | 6/1990 | Babson et al. . |
| 4,941,841 | 7/1990 | Darden et al. .................. 361/685 |
| 5,004,867 | 4/1991 | Mast .................. 174/35 GC |
| 5,006,959 | 4/1991 | Freige et al. . |
| 5,035,396 | 7/1991 | Krum et al. . |
| 5,065,262 | 11/1991 | Blackborow et al. . |
| 5,311,397 | 5/1994 | Harshberger et al. .................. 361/683 |

OTHER PUBLICATIONS

Designers Guide 10A, Primec Corporation, dated Jun., 1969.
IBM Technical Disclosure Bulletin, vol. 28, No. 7, Dec., 1985, pp. 2785-2798, "Industrial Personal Computer for Class C Industrial Environment".

Primary Examiner—Michael W. Phillips
Attorney, Agent, or Firm—Dilworth & Barrese

[57] ABSTRACT

A portable computer includes a processor, processor associated memory and control circuitry, and a memory disk drive assembly for storing software programs to form an integral computer unit. The integral computer unit has a CPU module, a display module, a user control module with a user control interface, module connectors, environmental protective barriers for blocking entry of EMI and moisture into the computer unit and a vibration isolator for energy absorbingly mounting the unit to the drive assembly. The display module includes a display device that is separately housed and removably interconnected with the CPU module. The modules are connected by hinges along at least one interconnecting edge of each module. The module connectors are disposed along at least one interconnecting edge of each of the modules to permit separation of the modules at non-hinged edges and pivotal movement about the hinged edges for improved accessibility. The connecting hardware may include a protrusion and groove in each module. Preferably, a gasket is included between the protrusion and groove. The computer preferably includes a fan assembly with an air sensor for sensing airflow through the fan assembly.

33 Claims, 11 Drawing Sheets

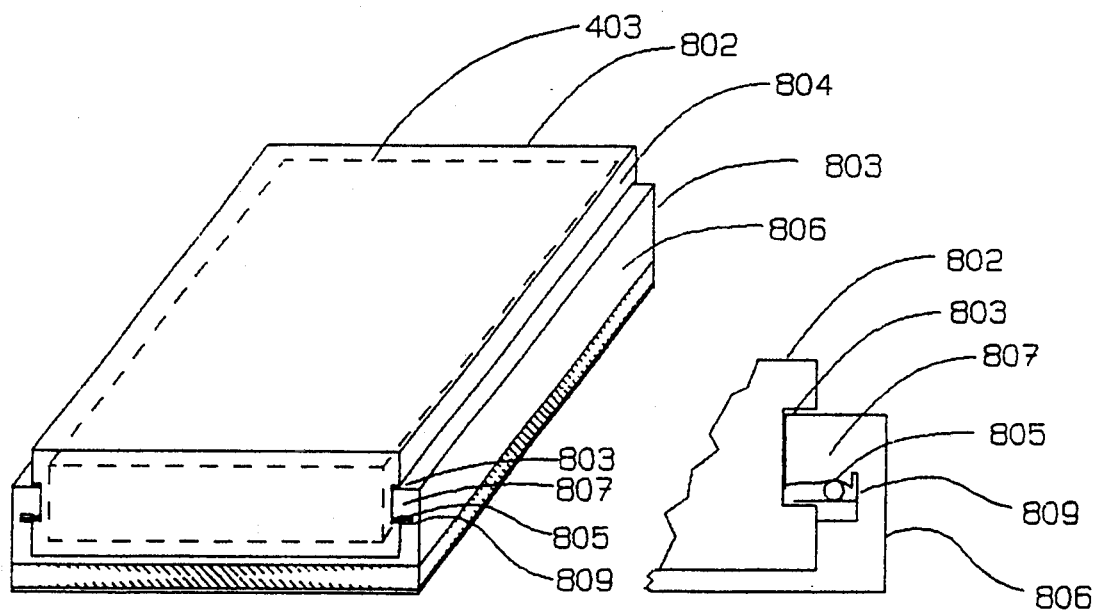
FIG. 8A
FIG. 8C
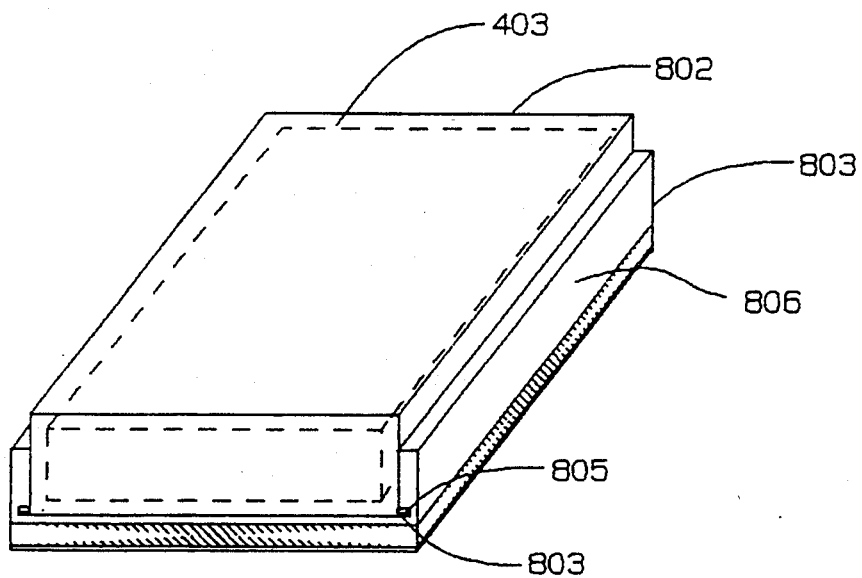
FIG. 8B

RUGGED MODULAR PORTABLE COMPUTER INCLUDING MODULES HINGED ALONG AN EDGE

TECHNICAL FIELD OF THE INVENTION

This invention relates to a portable and modular computer unit; particularly a computer unit which includes ruggedized features to enable operation of the computer unit in severe environmental conditions.

BACKGROUND OF THE INVENTION

Advances in computer and computer component technology have dramatically reduced the physical size of a computer while processing and storage capabilities were increased. Computers that are made portable, i.e., made adequately small and light weight for frequent transport, can now match the processing and storage capabilities of computers which occupied a whole office desk just several years ago. However, unlike a desktop computer, a portable computer is subject to the wear and tear, shock and vibration from the frequent transport. Unless there are protective measures incorporated in the design of the computer, it and the apparatus resident therein will have a much shorter operational life.

Portable computers are intended to be transported to different locations, usually between offices and/or homes. Usage of the computer on transports such as trains, automobiles or airplanes is anticipated. However, it is uncommon to expect usage of the computer in an environment which is uncomfortable for the user, such as in the rain, under the sun in the desert or in an unusually dusty or electromagnetically noisy conditions. A commercially available portable computer will likely fail to operate in such severe environmental conditions, unless it is incorporated with ruggedizing mechanisms. The commercially available portable computers are usually provided with the maximum processing and storage capacity anticipated to be needed, even when the maximum capacity is rarely, if ever used. It is usually difficult to alter the processing and storage capabilities without replacement of the unit with another unit more tailored to the user's new requirements.

Still another drawback of a portable computer is the greater potential of unauthorized access of the stored information, which may be privileged or secret information. This is because the computer is usually not fixed to a secured area.

SUMMARY OF THE INVENTION

The present invention relates to a portable computer which can be used for Command Control Communications and Intelligence, data acquisition, system control and monitoring, simulation applications, or as the core of a specialized portable or fixed test system. It can also be operated as a stand-alone unit or as part of a larger system such as an intelligent terminal in a communications system.

The computer unit according to the present invention is incorporated with ruggedizing designs which enable the computer unit to operate in severe environmental service conditions such as in heavy dust and rain, vibration during transport in vehicles or aircrafts, and in an area having a heavy concentration of electromagnetic interference, such as called for in MIL-STD-461. Ruggedization techniques and designs incorporated in the computer unit according to the present invention include the use of: special electrically conductive gaskets between all joints to block entry of EMI, moisture and dust; rain and dust resistant air-intake assembly; durable and protective covering; EMI and moisture preventive expansion card plates; shock absorbing isolators for mounting sensitive apparatus such as disk drives; and disk drive encasement which selectively secures the drives from movement and allows easy removal, preventing theft of the disk drive and the information stored therein. A modular design permits the computer to be easily configured, upgraded, or reconfigured to specific user requirements while maintaining its rugged characteristics.

BRIEF DESCRIPTION OF THE DRAWINGS

FIG. 8A shows a disk drive assembly according to a preferred embodiment of the present invention.

FIG. 8B shows a disk drive assembly according to an alternate embodiment of the present invention.

FIG. 8C illustrates the lock and clamp mechanism of the disk drive assembly.

DETAILED DESCRIPTION OF THE INVENTION

Figure 1:
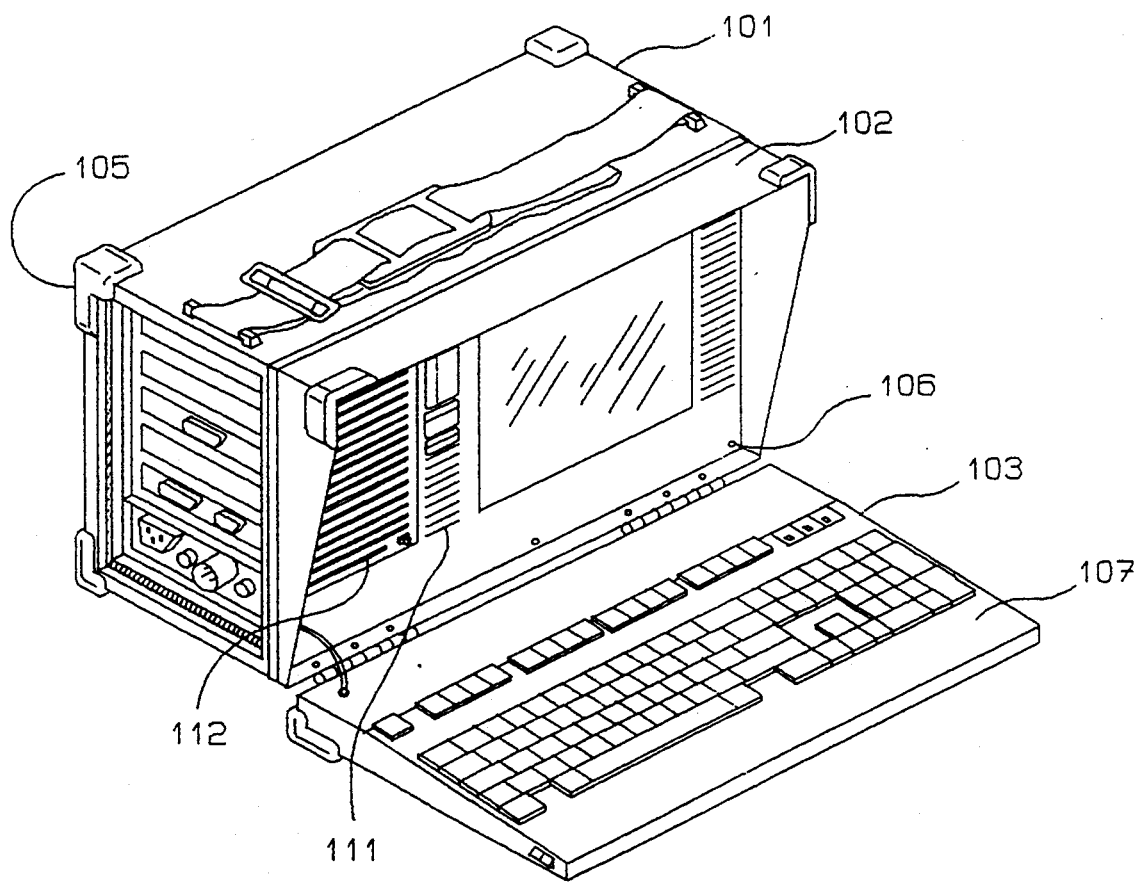
FIG. 1 is a perspective view of the computer unit acceding to the present invention.

FIG. 1 is a perspective view of the computer unit according to a preferred embodiment of the present invention. As shown, the computer unit comprises three modules—a CPU module 101, a display module 102 and a user control module 103. The CPU module 101 includes circuit card assemblies having components including a processor, control circuitry including video and disk drive controls, memory and stored programs necessary for providing the computer processing, control, mass storage and input/output functions. The display module 102, which is fastened to the front of the CPU module 101 via six easily removable bolts 106, includes a display device 110, operator interface displays and controls 111 and an air intake assembly 112.

The display module housing includes extended top and side portions which provide protection against precipitation such as rain or snow and shade the display window against bright ambient light conditions such as in the sunlight for improved readability. The user control module 103, which is hinged to the bottom front of the display module 102, includes a computer keyboard 107 for interfacing the circuits in the CPU module 101. Other user interfaces such as a trackball may be used and may also be integrally installed at the keyboard 107. The user control module 103 hinges up onto the front of the computer unit against the display module 102 for stow-away portability. When used in the hinged-up or folded position, the user control module 103 also serves as a cover for the computer unit. An adjustable shoulder strap 108 enables hands-free transportation. When the user control module 103 is hinged down for use, the placement of the hinges 113 causes the user control module 103 to act as a fulcrum which automatically tilts the display 110 at an angle for better viewing by the computer user. Molded protection bumpers 105, which may be made of polyurethane, rubber or the like, are fastened to all eight corners of the computer unit to provide protection from bumps and shock. Preferably, a polyurethane compound is used to provide the proper shock protection and ensure the bumpers 105 and the computer do not skid on a smooth work surface. The left side of the CPU module 101 serves as an I/O and expansion card area.

Figure 2A:
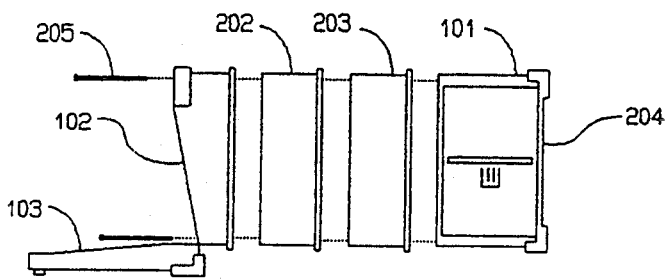
FIGS. 2A to 2G show various modular configurations of the computer unit according to the present invention.

FIGS. 2A to 2F are right side views of various modular implementations of the computer unit according to the present invention. The modular implementation permits the computer to be configured to meet a variety of different requirements. Numerous other advantages are derived from the modular design according to the present invention. For example, the performance characteristics and physical size of the computer are more tailored to what is actually required, rather than like an ordinary general purpose computer, the size and performance characteristics are typically selected to accommodate the maximum configuration anticipated. If added computing or memory capacity is needed, the user need only add modules to provide additional capability. Another benefit is that the computer can be upgraded or can incorporate new technology by simply changing a module. Other advantages derived from the modular design include the ease of adding or removing the modules, the ease of access of the modules for service and the reduction in equipment down time. FIGS. 2A, 2B, 2C, 2D and 2E show different modular implementations of the computer. FIG. 2A shows a display module 102 as previously shown in FIG. 1, expansion modules 202 and 203 and a rear module 204, which may include CPU module 101 as previously shown in FIG. 1. The modules are fastened together using bolts 205, which may be in different lengths depending on the number of attached modules. The modules may also be hinged along one edge to permit the modules and the computer unit to be opened accordion style for improved accessibility. Other fastening techniques such as screws, latches, catches or the like may also be used. The rear module 204 includes a rear cover. The expansion modules 202 and 203 may contain various elements of a computer such as display, CPU, expansion cards, additional memory, disk storage, etc.

Figure 2G:
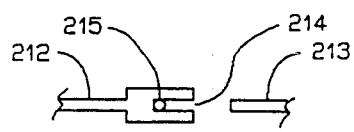
Figure 2B:
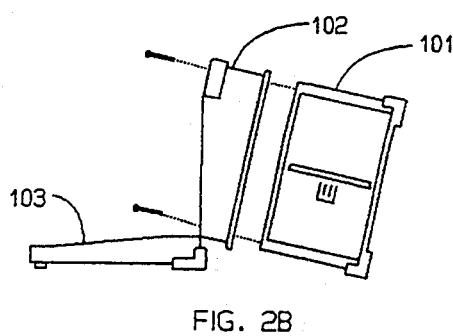
Figure 2E:
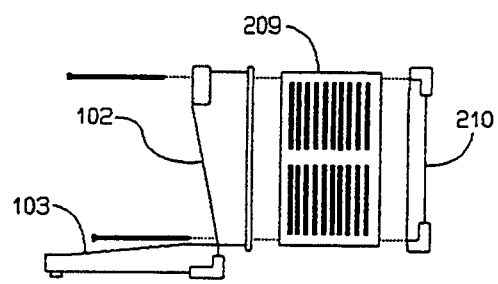
Figure 2C:
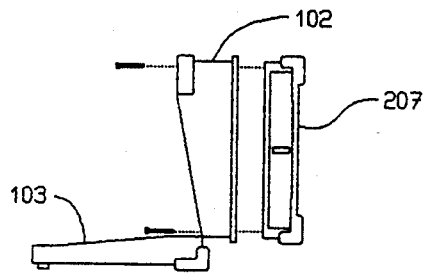
Figure 2F:
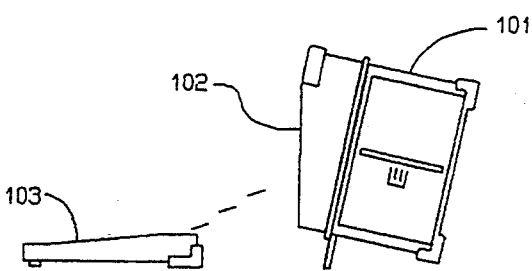
Figure 2D:
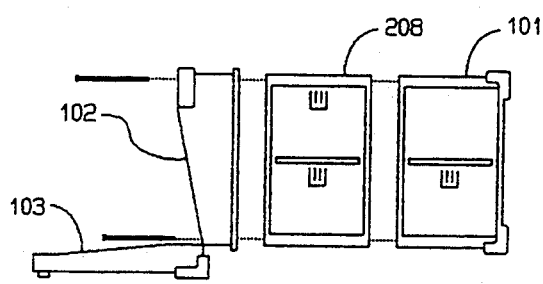

FIG. 2B shows the basic computer unit as previously shown in FIG. 1, which includes a user control module 103, a display module 102, and a large CPU module 101. FIG. 2B further shows the angle of tilt of the display module 102 when the computer unit is placed on a flat surface with the user control module 103 in the hinged-down position. FIG. 2C shows an implementation with a user control 103, a display module 102, and a small CPU module 207. FIG. 2D shows an implementation with a user control module 103, a display module 102, a large expansion module 208, and a large CPU module 101. FIG. 2E shows an implementation with a user control module 103, a display module 102, a large expansion module 209 containing the computer circuit cards and a rear cover 210. FIG. 2F shows a detachable user control module 103, a display module 102, and a large CPU module 101. The computer unit as shown in FIG. 2B has dimensions of about 11 inches in height, 17 inches in width and 9 inches in depth with the user control module 103 in the hinged-up position. The basic unit weighs about 20 pounds. A computer unit as shown in FIG. 2A weighs about 25 pounds.

An important aspect of the computer unit according to the present invention is the environmental protection features incorporated in the modular design. Referring to FIG. 2G, module 212 includes at the outer edges of the module a groove 213, in which a hollow circular silicone, electrically conductive gasket 215 is deposited. The groove and gasket combination is run completely around one edge of the module. The edges of a second interfacing module 214 fits into the groove and compresses against the gasket 215. Gasket compression stops, which limit the compression of the gasket 215, are located at each of the six bolts 205 used to clamp the modules together. Preferably, the gasket may be one available from Chomerics, part number CHO-SEAL ® 1285. With the implementation, EMI, moisture and dust intrusion at the joints between the modules are nearly completely eliminated and the computer is able to operate in severe environments such as specified in MIL-STD-462 and MIL-STD-810. Each module according to the present invention is housed in a protective cover which is rigid, waterproof and acts to shield the interior from EMI intrusion.

Figure 3A:
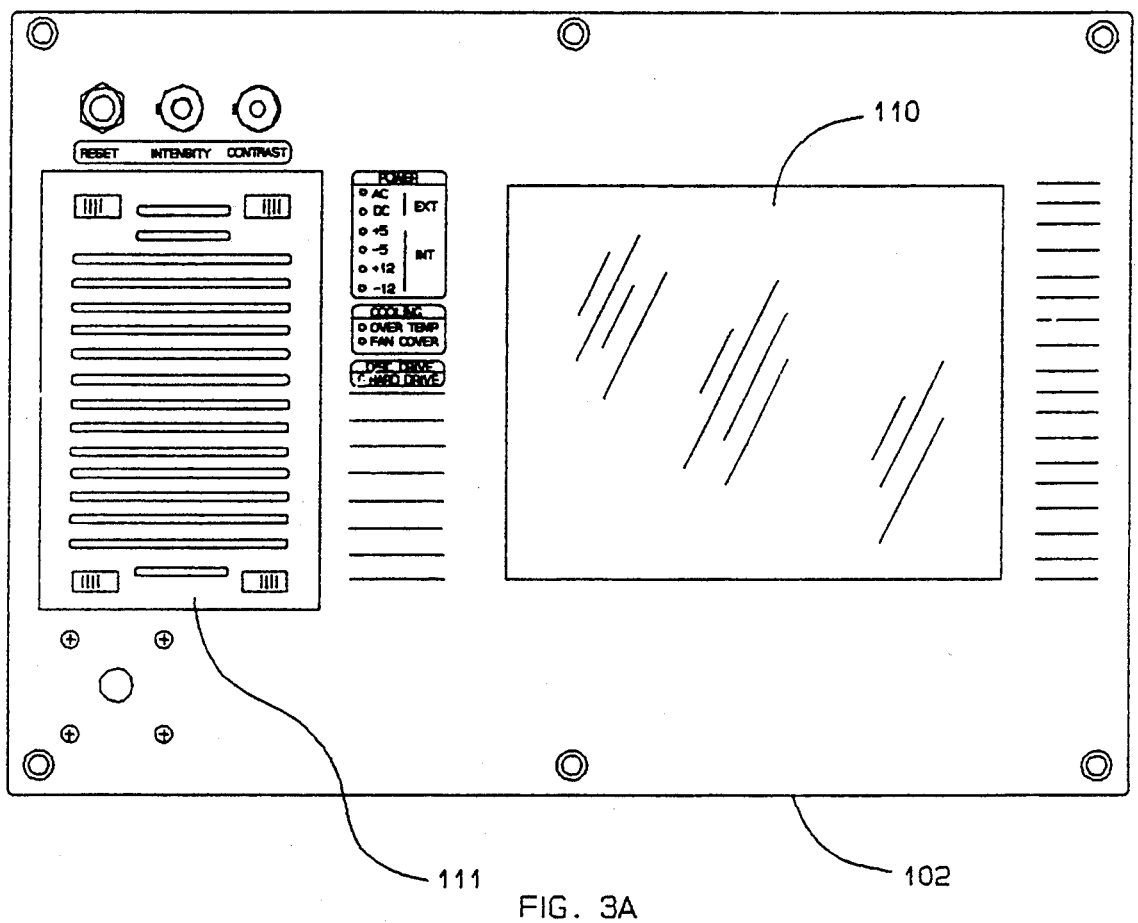
FIG. 3A shows the front panel of the display module according to a preferred embodiment of the present invention.

FIG. 3A shows the front panel of the display module 102. A display device, preferably a high resolution color flat panel display in active matrix LCD, is mounted to the back of the display module front panel behind a glass window 110. To ensure EMI integrity, for example, within MIL-STD-461 specifications, the window 110 is coated with an electrically conductive Indium Tin Oxide (ITO) coating which is applied to the back side of the window 110. The ITO coating is terminated around the periphery of the rear surface of the window 110 with a conductive silver bus bar (not shown). This bus bar is then connected to the aluminum chassis with a conductive gasket (not shown). This technique provides EMI shielding without compromising the readability of the display through the window 110. An anti-reflective coating is applied to the front surface of the window 110 to enhance readability of the display in high ambient light conditions such as bright sunlight.

Figure 3B:
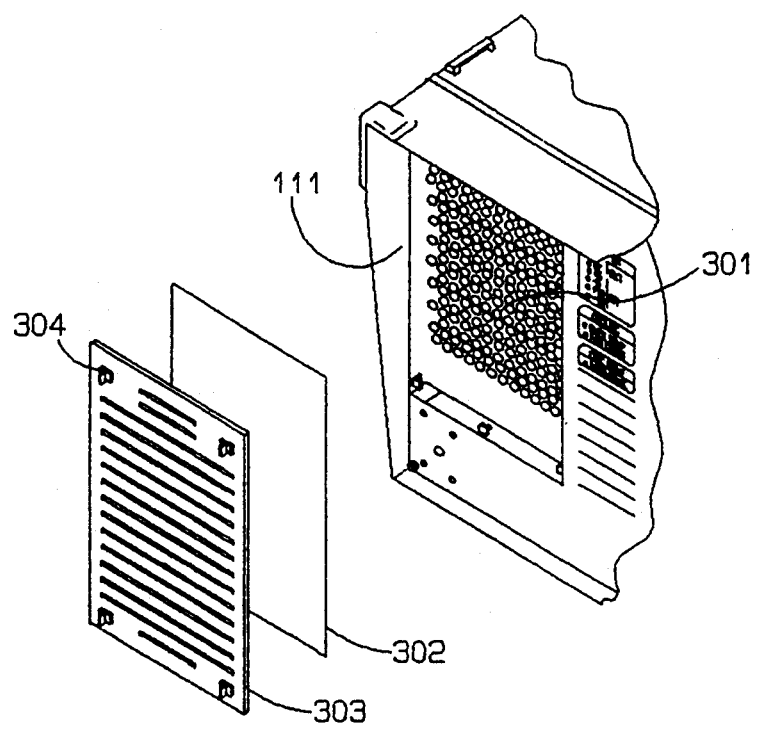
FIG. 3B illustrates the air-intake assembly according to a preferred embodiment of the present invention.

A removable air intake grille assembly is located on the left side of the front panel. FIG. 3B shows an exploded view of the grille assembly 111 and its associated air intake components. Cooling external air is drawn into the computer through the grille assembly 111 to cool the computer. EMI integrity is provided by a pattern of small holes 301 in the front panel. The size and number of these holes is arranged to ensure adequate cooling air flow through the display module 102 to the CPU module 101 while maintaining EMI integrity. An air filter 302 is located in front of this pattern of holes 301 to filter dust from the cooling air stream. The air filter 302 is preferably comprised of two different media bonded together into a common filter element. The outer filter material is chosen to be more course than the inner filter. It is used to remove larger particles of dust. Preferably, demembered polyurethane is used. The inner filter is preferably made from a 3M ® "Filtrete" material with a permanent dipole charge to capture the fine dust particles. The air filter 302 is held in place by an air intake grille 303 which attaches to the front panel via four slide latches 304. The air intake grille 303 includes a series of horizontal slots which angle upwards as they progress from the front to the rear of the grille assembly 202. This upward tilt of the slots repels falling rain or snow and thus prevents precipitation from entering the computer via the grille assembly 111.

Figure 4:
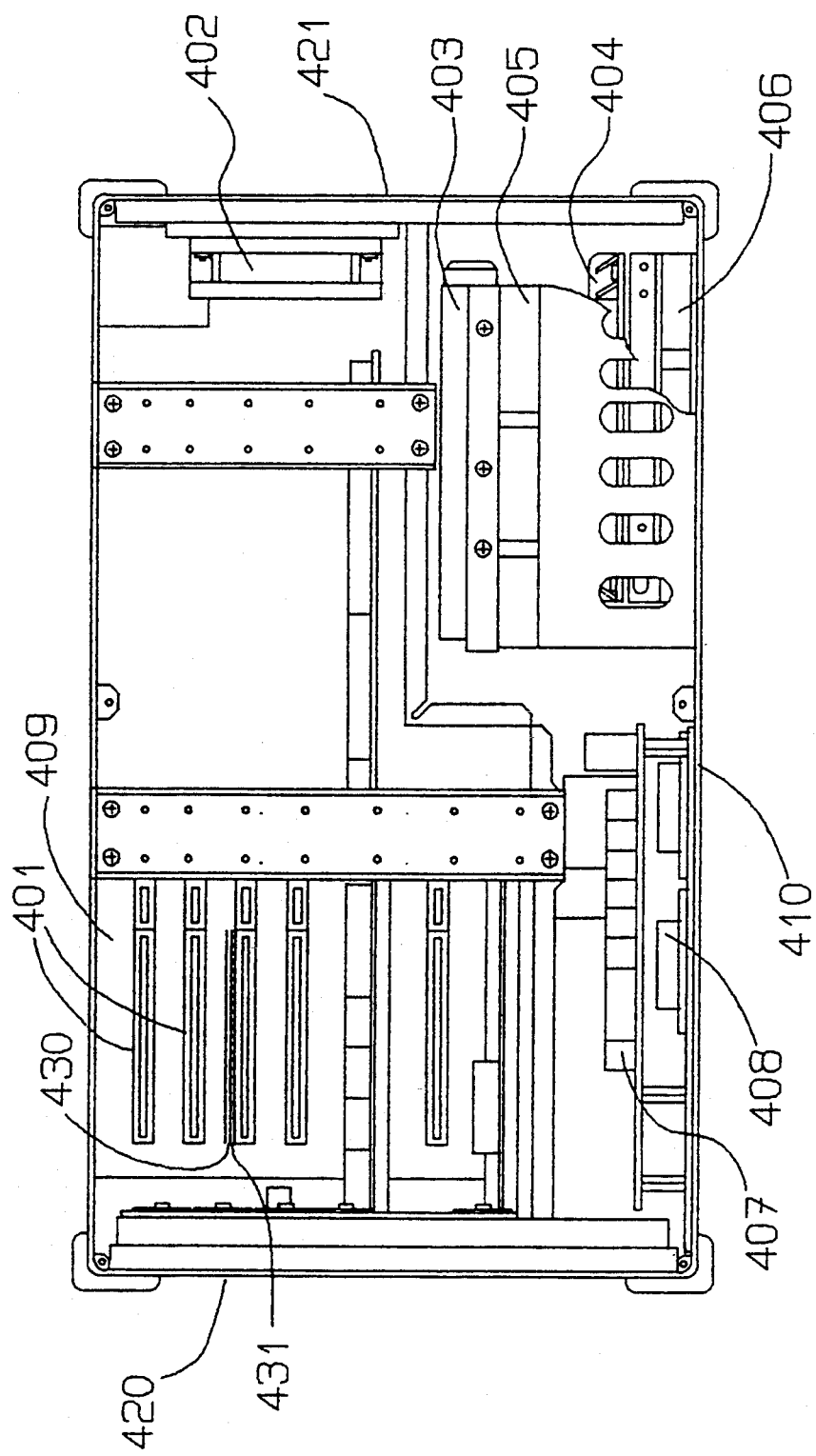
FIG. 4 is a front view of the inside of the CPU module according to a preferred embodiment of the present invention.

FIG. 4 is a front view of the interior of the CPU module 101 according to a preferred embodiment of the present invention. Installed in the chassis of the CPU module 101 are circuit boards 401, which are printed circuit boards with electronic components such as processor and processor control integrated circuits mounted thereon. The electronic components perform functions such as processing, video and I/O controls, and mass storage. The circuit boards 401 plug into a backplane 409 attached to the back of the chassis. (Refer to FIG. 10 for a block diagram of the computer components.) In the embodiment shown in FIG. 4, the circuit boards 401 are IBM PC/XT or AT form factor compatible and the backplane 409 is preferably electronically passive with a capacity to accept seven plug-in boards. Other implementations are possible with the backplane containing active components, e.g., a motherboard such as found in a typical IBM PC. The circuit boards 401 may be a different form factor and implement a computer with a different architecture such as VME, Multibus, Std Bus, S-bus, etc. The circuit boards 401 may interface to external devices or expansion cards through I/O area 420.

Figure 5A:
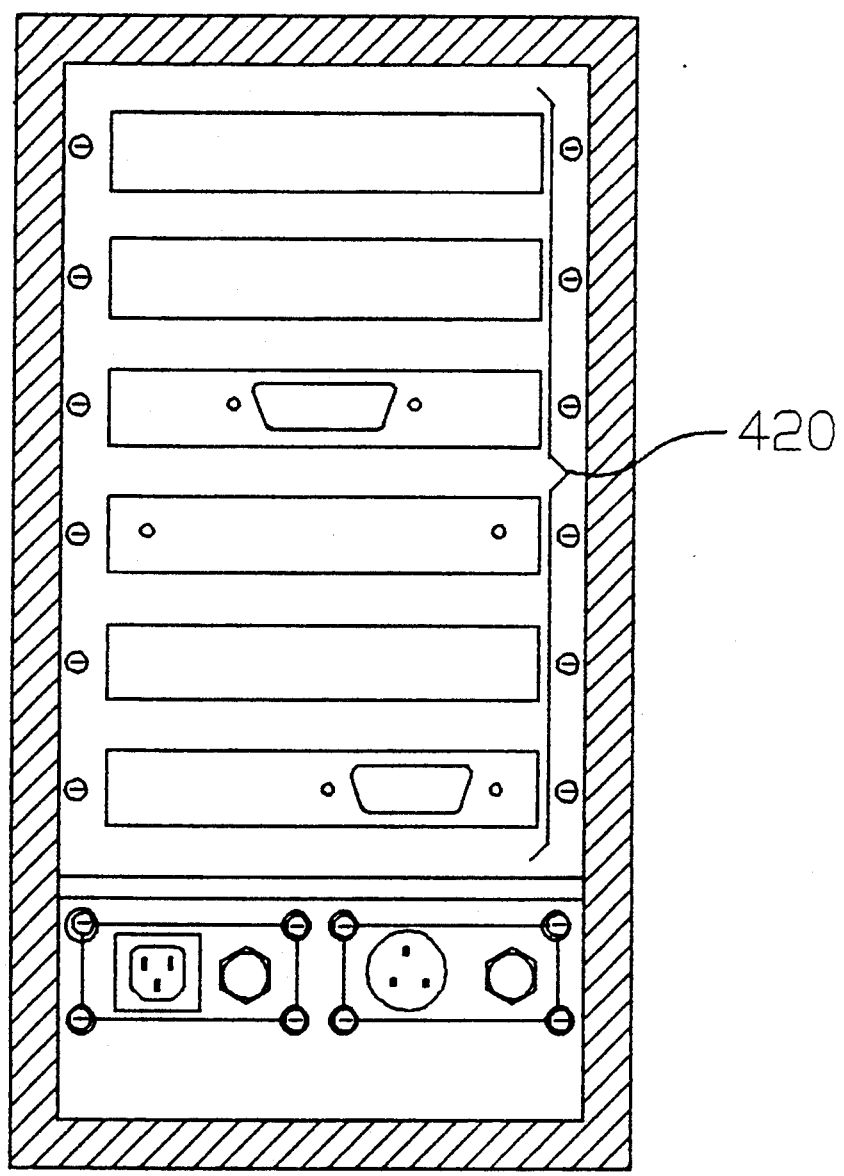
FIG. 5A shows the I/O expansion card area of the CPU module according to a preferred embodiment of the present invention.

FIG. 5A shows the I/O and expansion card area 420 viewed from the left side of the CPU module 101. A common bus structure may be used to electrically connect the expansion cards, power and/or disk drives. An example of a bus structure would be the PC/AT ISA bus which may be implemented as a passive backplane printed circuit board (PCB) running horizontally from the front to the back of the module. The PCB includes a male connector on one end and a female connector on the other end to connect additional expansion modules similarly equipped with the male/female connectors.

Beneath the circuit cards 401 are EMI filters 407 for AC and DC power. A power supply 408, located below the EMI filters 407, is bolted to the bottom surface of the aluminum chassis 410. This provides a heat conductive surface for the power supply components.

An improved technique of extraction and removal of heat from the computer apparatus is by use of air plenum heatsinks. An air plenum heatsink includes an open center area surrounded by an outer heat conductive medium, such as metal, and inlet and outlet ports which allow air within the open center area to be forced through or withdrawn from the center area. Typically, the air plenum heatsink is positioned adjacent to the apparatus being cooled (e.g., circuit board 401) so that heat from the apparatus is conducted to the heat conductive surface of the air plenum, via conduction, convection and/or radiation. Preferably, the outer heat conductive medium extends the full length of a module with the inlet and outlet ports being terminated outside the modules, thereby causing all controlled airflow in the interior of the module to be through the center area of the air plenum heatsink. A heat conductive material such as silicone or urethane binders containing thermally conductive fillers may be placed between the air plenum heatsink and the apparatus to improve thermal transfer. The heat extracted from the apparatus is then cooled by the external air flowing through the open center area of the plenum or is exhausted out of the computer by a fan.

The fan 402 exhausts air from the CPU module 101 and the computer unit. EMI integrity at the air exhaust is provided by a pattern of small holes 601 (refer to FIG. 6). The size and number of these holes is arranged to ensure adequate cooling air flow through the computer while maintaining EMI integrity. The fan 402 includes electronic circuitry which senses exhaust air temperature and controls the speed of the fan to maintain a constant internal temperature; preferably, the internal ambient temperature is maintained at less than 35° C. However, during operation in a high temperature environment, such as at an external temperature of 50° C. and the computer is operated at 125 watts, the fan 402 will run at full speed and the internal temperature will be kept at 55° C. At normal room temperature, the fan 402 is running at a reduced speed. This feature minimizes fan noise and air flow for most room temperature environments.

Figure 7A:
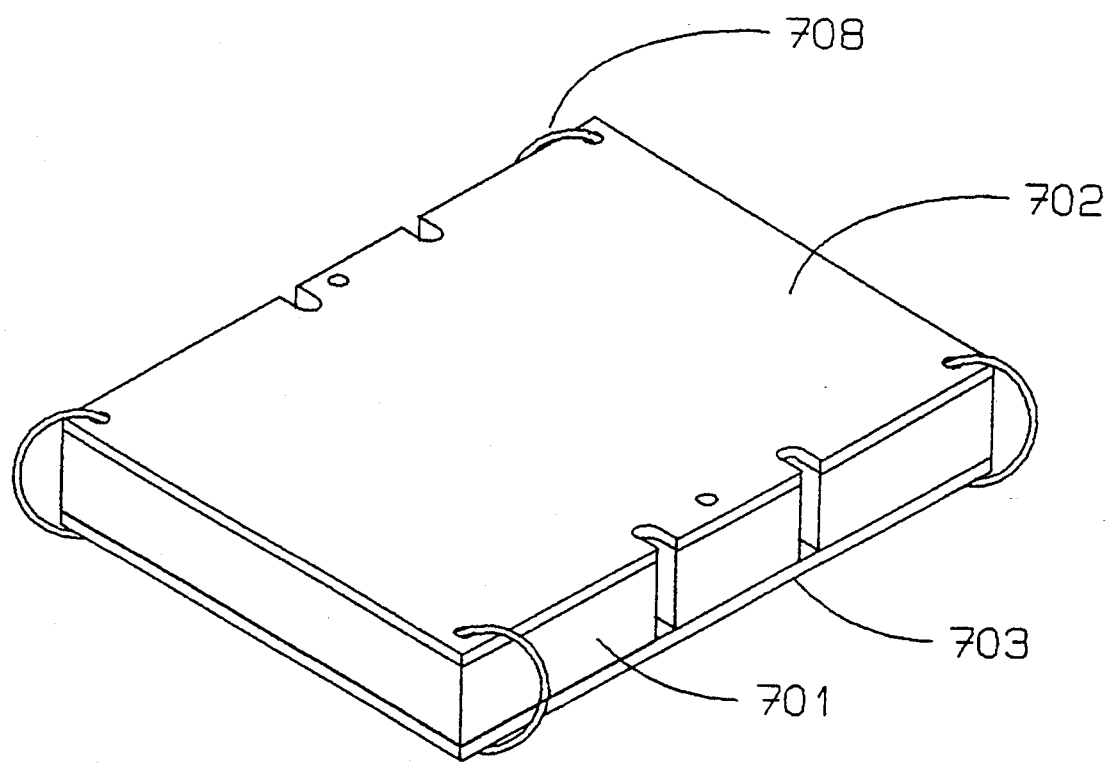
FIG. 7A is a perspective view of a vibration isolator according to a preferred embodiment of the present invention.
Figure 7B:
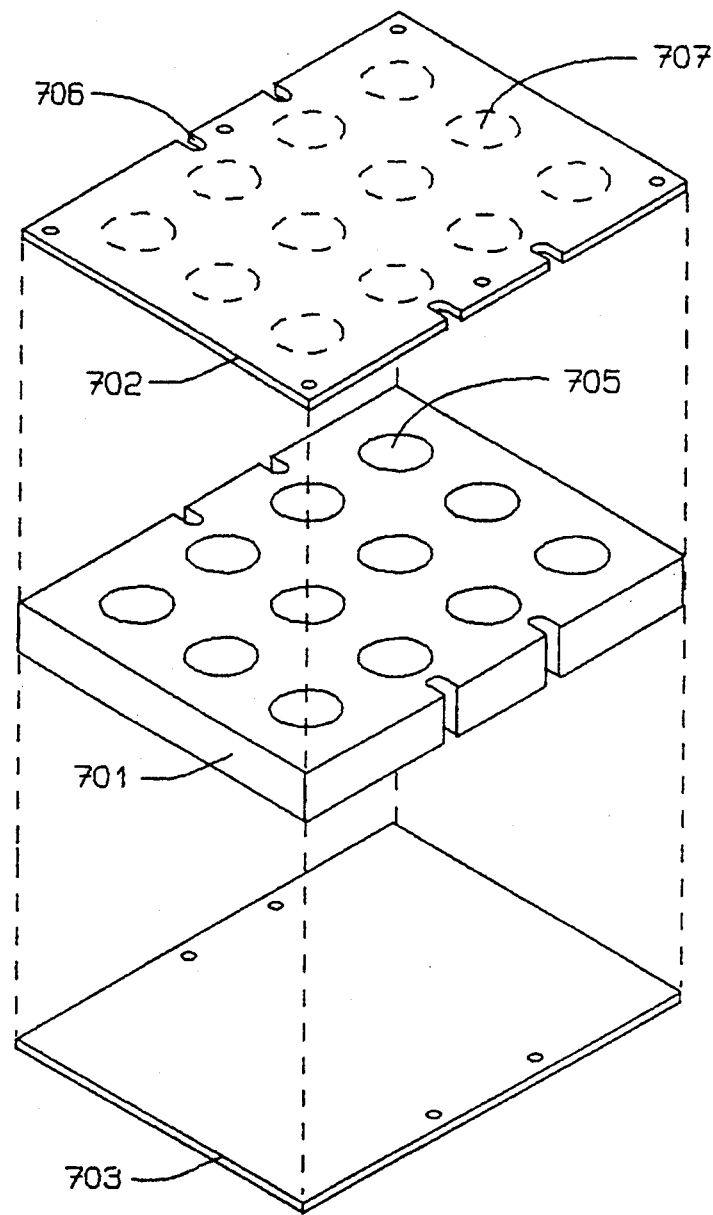
FIG. 7B is an exploded view showing the components of the vibration isolator.

The floppy disk drive 403 and hard disk drive 404 are mounted on vibration isolators 405 and 406 to afford protection to these components from severe shock and vibration conditions such as during transport in an aircraft. (FIGS. 7A and 7B show the vibration isolators in further detail.) The user may access the disk drives through the disk drive access area 421.

Figure 5B:
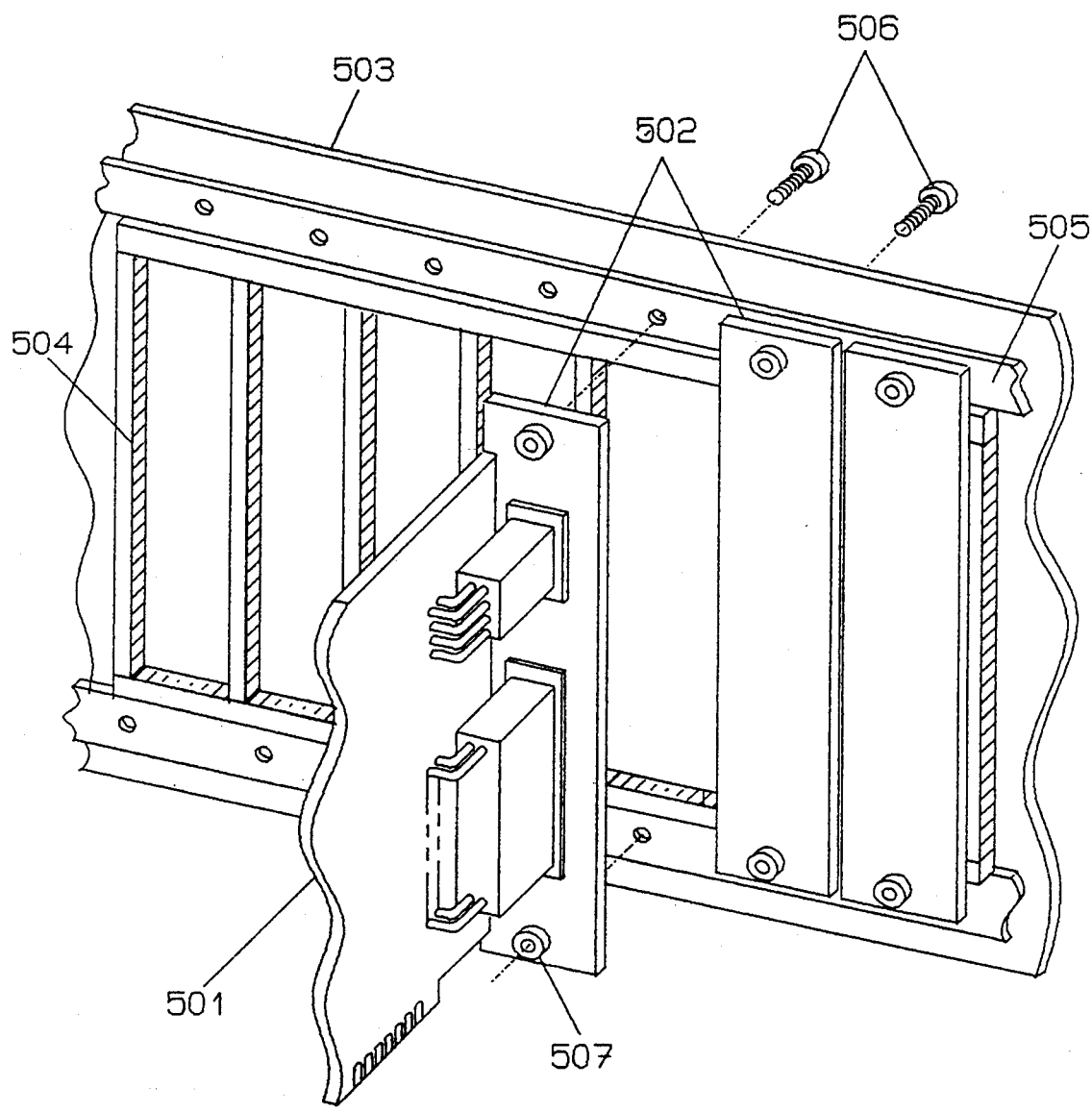
FIG. 5B shows an alternate embodiment of the I/O and expansion card area of the CPU module.

The I/O and expansion card area 420 (FIG. 5A) is an area commonly prone to EMI and moisture leakage. A technique according to the present invention provides EMI integrity surpassing MIL-STD-461 and/or NACSIM-5100A and moisture sealing surpassing MIL-STD-810 or similar specification. Referring to FIG. 5B, the technique includes the use of special I/O plates 502 in place of the normal bracket supplied with the commonly available expansion cards or slot CPU. The I/O plates 502 are attached to the CPU module chassis wall 503. The I/O plates are preferably made from a sheet of aluminum or similarly conductive metal or metalized plastic. Each of the I/O plates 502 includes connector holes cut into it to match those on the standard bracket furnished with the expansion circuit card 501. The I/O plates 502 are slightly wider than the standard bracket to provide a surface for a gasket to seal against. The I/O plates 502 are secured to the mating surface of the special panel via two screws 506 into captive fasteners 507, PEMS or the like. The CPU module chassis wall 503 includes slots for each board for facilitating a gasket 504, which is placed around each slot. A gasket stop 505 is provided at the top and bottom of the panel where the screws 506 attach the I/O plates 502 to the panel. The gasket stop 505 is used to limit compression of the gasket 504 to limits specified by the gasket manufacturer.

To provide EMI and moisture protection as specified, the gasket 504 must be soft enough to be easily compressed by the I/O plates 502 without distortion, while not causing galvanic corrosion with the mating materials. According to the preferred embodiment of the present invention, a gasket which is comprised of a soft foam core surrounded by a nylon material and impregnated with a conductive silver compound is used. The gasket 504 may be one commercially available from Schlelgel®, part designation, C²EMI. An alternate gasketing material which may be employed is a silver loaded silicone EMI gasketing material which is deposited in a groove milled into a wall of the computer. This provides a gasket stop all along the EMI gasket.

Figure 6:
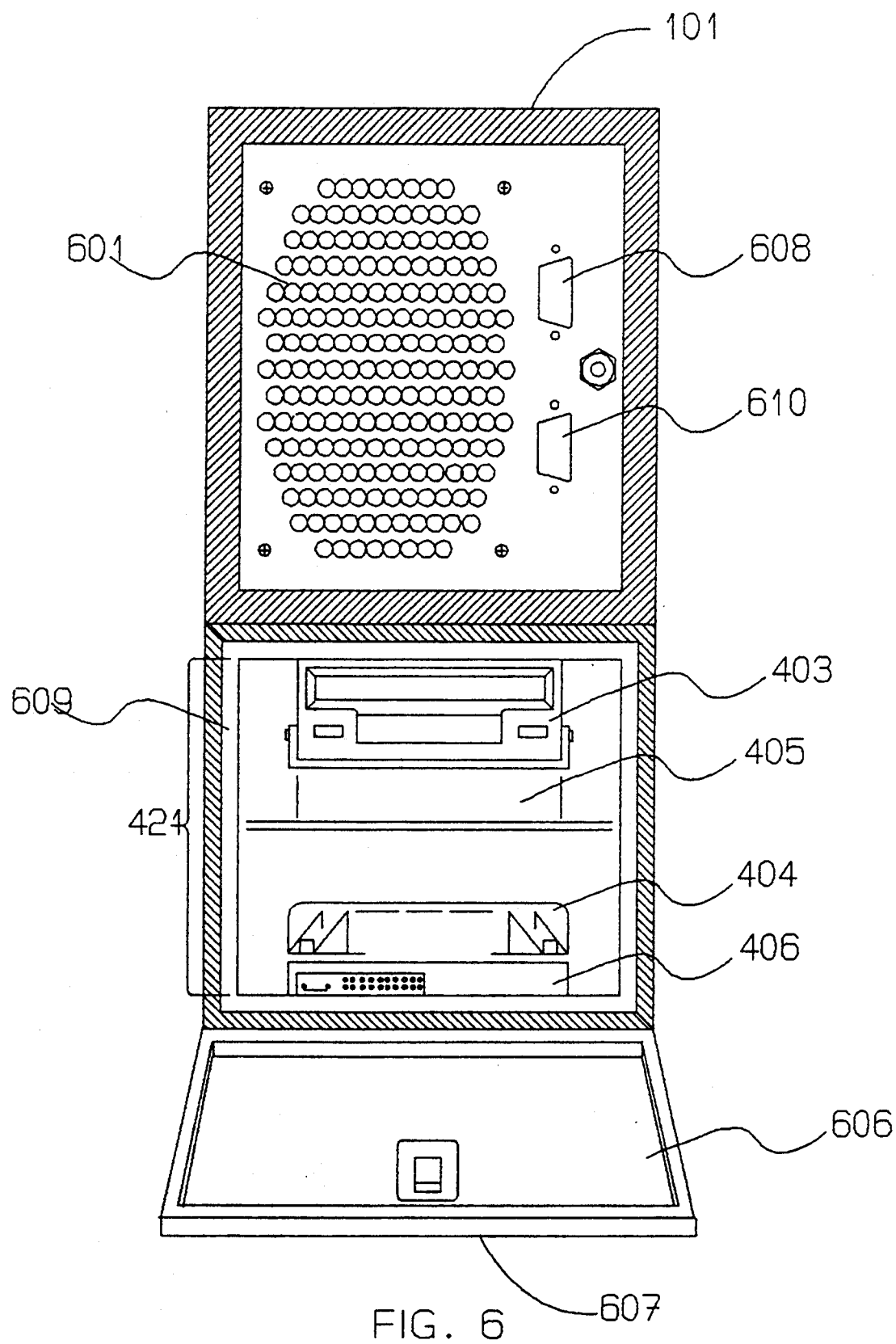
FIG. 6 shows the air exhaust and disk drive access area of the CPU module according to a preferred embodiment of the/present invention.

Referring now to FIG. 6, which is a right side view of the disk drive access area 421 of the computer, which may also be in the CPU module 101. Air exhausted by fan 402 exits from the top half of the computer via a pattern of holes 601, which are selected to be sufficiently small to provide EMI integrity. Rain precipitation would not enter through holes 601 because of the operation of the fan 402 exhausting air outward through the holes 601. Serial or parallel connection ports 609 and 610 may be provided to interface external peripheral devices such as a printer. Access to the floppy disk drive 403 and hard disk drive 404 is at the bottom half of the computer via a hinged disk drive access door 606. The drive access door 606 pivots down as shown for access to the disk drives. It pivots up and latches in place with a sliding latch 607 to provide protection to internal components from external environments. A gasket 608 is used between the door 606 and the CPU module chassis. The gasket 608 also provides EMI shielding as well as moisture sealing and is soft enough to permit easy closure of the door. A gasket similar to the gasket 504 previously described may be used. It should now be apparent to one ordinarily skilled in the art that the computer according to the present invention is provided with the mechanisms necessary to prevent or inhibit entry of moisture, dust and EMI at all openings including joints, gaps, seams, and vents. The computer according to the present invention is capable of sustained operation while being exposed to a precipitation event such as rain or snow, or in a dust storm, or in an area having a heavy concentration of EMI.

Another technique to ruggedize the computer unit according to the present invention is the provision of vibration absorbing isolators to absorb or substantially prevent damage to sensitive computer apparatus from vibrational force or shock. For example, disk drives 403 and 404 are mounted on such vibration absorbing isolators 405 and 406 respectively.

FIG. 7A is a perspective view of a vibration absorbing isolator according to the present invention. A continuous layer of vibration isolation material 701 which serves to absorb vibration energy, is bonded between two support plates 702 and 703 by an adhesive film. A computer such as a disk drive (403 of FIG. 6) may be mounted to one support plate while the other plate is fastened to a supporting structure such as the computer chassis. A thicker or more dense energy absorbing material will provide greater vibration isolation. For example, in a preferred embodiment of the invention, the thickness of isolation material 701 is made much greater than the thickness of each of the support plates 702 and 703, thereby allowing for relatively large amounts of energy to be absorbed. Preferably, the vibration isolation material is made of open cell polyurethane foam, which is commercially available from the Scott Corporation, product designation SIF-100PPI. The vibration isolation characteristics of the isolator may also be affected by other factors such as vibrational resonant frequency and transmissibility at resonance, which in turn may be affected by the combination of the computer apparatus when attached to the vibration isolator when it is subjected to shock or vibration. Such characteristics can be optimized by the placement of holes 705 throughout the vibration isolation material as shown in FIG. 7B. The size, number and position of the holes can be selected to modify the required isolation properties.

The mounting plates 702 are preferably rigid and may have access areas 706 for mounting hardware. Holes 707 may also be placed in the plates to reduce weight. One or both of the mounting plates 702, 703 may be eliminated if desired. For instance, the vibration isolation material 701 could be bonded directly to the component and/or the support structure. Alternatively, a secondary support mechanism such as flexible cables 708 may be implemented to capture the component in the event of a failure of a bond or the vibration isolation material.

FIG. 8A shows a disk drive 403 in a protective enclosure 802. The enclosure 802 includes at its sides an indent and extended edges 804 to form a "C" shaped channel 803. A housing 806 having a protrusion 807 that has substantially the same width as the channel 803 slidingly mates with the channel 803, thereby allowing the disk drive 403 and enclosure 802 to be selectively and removably fixed upon the housing 806. For added protection from vibration or shock, the housing 806 may be affixed to a vibration isolator 406 (FIGS. 4 and 6), which is in turn affixed to the computer chassis.

FIG. 8B shows an alternate embodiment in which the housing 806 includes a channel for slidingly receiving the protrusion 803 of enclosure 802. FIG. 8C illustrates a mechanism for locking the enclosure 802 to the housing 806. An "L" shaped clamp 809 is disposed between the protrusion 807 of the housing 806 and the channel 803 of the enclosure. When lock 805 is turned in a clockwise direction, the clamp 809 is pushed downward, exerting a clamping force on enclosure 802 to securely retain it and prevent its movement even under severe shock and vibration conditions. The disk drive 403 and enclosure 802 can be easily removed by releasing clamp 809 by turning lock 805 counterclockwise. Other lock and clamp mechanisms such as a level actuated lock and retaining plates may also be used.

Figure 9:
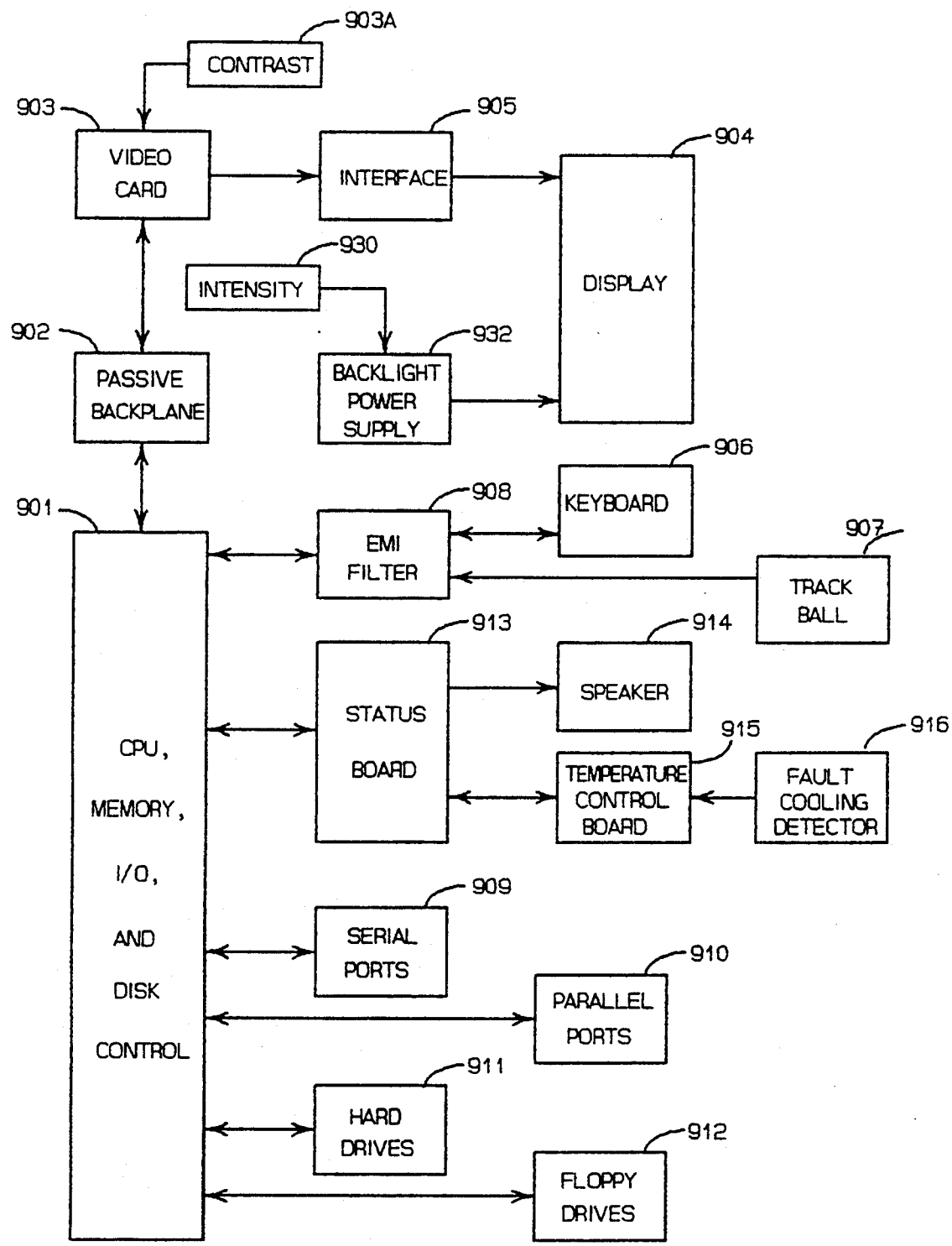
FIG. 9 is a block diagram of the major functional elements of the computer unit according to a preferred embodiment of the present invention.

FIG. 9 is a block diagram which shows the interconnection between the major functional elements of the computer according to the present invention. Processor 901, which includes associated memory and I/O and disk drive control circuits, executes or processes substantially all operations of the computer. The processor 901 is connected through a passive backplane 902 to a video card 903, which in turn controls display 904 through video interface 905. A keyboard 906 and a trackball 907 may be connected to the processor 901 through EMI filter 908. Serial ports 909 and parallel ports 910 are provided to interface external devices. Hard disk drives 911 provide mass memory storage, which may include operational and application software. Floppy disk drives 912 provide user interaction functions such as system initialization, set-up, diagnostics, memory data transfer and software upgrade.

A Status board 913 is in direct electrical communication with CPU, MEMORY, IO, and DISK CONTROL 901, a speaker 914 and a temperature control board 915. The status board communicates all vital status information relevant to operation of the rugged modular portable computer of this invention. A cooling fault detector 916 is in electrical communication with temperature control board 915 to communicate temperature control information therewith. Intensity control 930 is electrically connected to backlight power supply 932, which is electrically connected to display 904. The intensity and backlight power supply provide for varying the display's backlighting. Finally, the contrast of video card 903 is controlled via contrast control 903A. The operations of these functional elements are well know to one ordinarily skilled in the art.

It will be understood that various modifications can be made to the embodiments of the present invention herein disclosed without departing from the spirit and scope thereof. For example, various sizes of the computer are contemplated, as well as various types of construction materials. Also, various modifications may be made in the configuration of the parts. Therefore, the above description should not be construed as limiting the invention but merely as exemplifications of preferred embodiments thereof. Those skilled in the art will envision other modifications within the scope and spirit of the present invention as defined by the claims appended hereto.

What is claimed is:

1. A portable computer having a processor, processor associated memory and control circuitry, and a memory disk drive assembly for storing software programs, forming an integral computer unit, comprising:
    a CPU module including:
        a) a plurality of circuit boards, said boards having said processor, said processor associated memory and control circuitry mounted thereon;
        b) a chassis, said chassis including means for receiving and transmitting electrical communication signals between said plurality of circuit boards; and
        c) means for interfacing said CPU module with external devices;
    a display module including a display device, said display module separately housed and removably interconnected with said CPU module;
    a user control module having a user control interface, said interface including a keyboard and said control module being separately housed and removably interconnected with said display module;
    means for connecting each of said modules to form said integral computer unit, said connecting means including hinges disposed along at least one interconnecting edge of each of said modules to permit separation of said modules at non-hinged edges and pivotal movement about said hinged edge for improved accessibility therebetween;
    environment barrier means, including gaskets, for blocking the entry of EMI and moisture into said computer unit, said gaskets disposed around areas exposed to said environment including between said connected modules; and
    a vibration isolator for energy absorbingly mounting said integral computer unit, including said disk drive assembly, to said chassis.

2. The portable computer according to claim 1, further including an expansion module having computer apparatus for one of connection to and exchange with an existing module of the computer.

3. The portable computer according to claim 1 wherein said means for connecting includes a protrusion and a groove in each module for cooperatively joining one module to another.

4. The portable computer according to claim 3 wherein said gasket is disposed between said groove and said protrusion that cooperatively join adjacent modules.

5. The portable computer according to claim 4 wherein said gasket is a hollow, silicone formed and electrically conductive.

6. The portable computer according to claim 1 wherein said display module includes a display glass window disposed in front of said display device, wherein said glass window is coated with an electrically conductive coating, said coating being terminated around the periphery of said glass window with electrically conductive means to ground electromagnetic energy which impinges upon said window.

7. The portable computer according to claim 1 wherein, said display module includes an air intake assembly, said assembly having a dust filter and means for substantially preventing entry of rain and electromagnetic interference (EMI).

8. The portable computer according to claim 1 wherein said user control module includes a trackball.

9. The portable computer according to claim 1 wherein said user control module includes a hinge for attaching said control module to said display module to allow said modules to be pivotally folded together about said hinge.

10. The portable computer according to claim 1, wherein said user control module includes means for attaching to said display module and tilting said display at an angle relative to said user control module.

11. The portable computer according to claim 1, wherein said CPU module includes an input/output interfacing area through which external devices are connectable, said area includes a plurality of openings for facilitating a plurality of expansion cards, each of said openings having a surrounding slot housing a gasket, and
    a metallic plate closing each of said openings, said plate includes means for compressing against said gasket thereby shielding said openings from EMI and moisture intrusion.

12. The portable computer according to claim 1 wherein said disk drive assembly includes:
    an enclosure having an indent formed between extended edges to form a channel along at least one of two sides;
    a housing having a protruding portion to slidingly mate with said channel of said enclosure;
    a lock and a clamp disposed in a cavity formed by the mating of said protruding portion of said housing and said channel of said enclosure, said lock having a first and second selectable position whereby when said lock is in said first position, said clamp is contacted against said enclosure, thereby retaining said enclosure in said housing.

13. The portable computer according to claim 1 wherein said vibration isolator further comprises:
    energy absorbing material adapted to absorb vibration energy; and
    a rigid plate mounted upon said energy absorbing material and removably supporting a computer unit, said rigid plate further being adapted to cooperate with said energy absorbing material to substantially prevent said energy from damaging said computer apparatus.

14. The portable computer according to claim 13, wherein said energy absorbing material includes a plurality of holes.

15. The portable computer according to claim 1, further including a fan assembly having means for sensing airflow through said fan and means for adjusting fan speed in accordance with preselected temperature settings.

16. The portable computer according to claim 1, further including an air plenum heatsink having an opening center area surrounded by an outer heat conductive medium, said medium for passing heat to said open center area and allowing airflow through said open center area whereby heat transferred thereto is removed via said airflow.

17. The portable computer according to claim 16, further including heat conductive material disposed on said outer heat conductive medium of said air plenum heatsink for improving heat transfer to said open center area.

18. A light weight and compact computer comprising:
a CPU module for housing processor components including a processor, processor associated memory and control circuitry;
a display module separately housed and interconnected with said CPU module, said display module for housing a display device and a display window, said window including shielding means for preventing entry and exit of EMI through said window;
an expansion module separately housed and interconnected with said display module, said expansion module for housing additional computer apparatus for connection to said CPU module; and
means for forming each said module into an integral computer unit, said means for forming including shielding means for shielding EMI and moisture from entering between said modules; and
hinging means disposed along at least one interconnecting edge of each of said modules to facilitate pivotal movement of said modules about said edge for improved accessibility.

19. The computer defined by claim 18, wherein said interconnected modules form an integral housing including precipitation entry inhibiting means for facilitating sustained operation of the computer while said computer is exposed to a precipitation event.

20. The portable computer according to claim 19, wherein said precipitation entry inhibiting means includes an air intake assembly having a dust filter and means for substantially preventing entry of rain and electromagnetic interference (EMI).

21. The portable computer according to claim 18, further including an expansion module having computer apparatus for one of connection to and exchange with an existing module of the computer.

22. The portable computer according to claim 18, wherein said means for connecting includes a protrusion and a groove in each module for cooperatively joining one module to another.

23. The portable computer according to claim 22, wherein said gasket is disposed between said groove and said protrusion that cooperatively join adjacent modules.

24. The portable computer according to claim 23, wherein said gasket is hollow, silicone formed and electrically conductive.

25. The portable computer according to claim 18, wherein said display module includes a display glass window disposed in front of said display device, wherein said glass window is coated with an electrically conductive coating, said coating being terminated around the periphery of said glass window with electrically conductive means to ground electromagnetic energy which impinges upon said window.

26. The portable computer according to claim 18, wherein said user control module includes means for attaching to said display module and tilting said display at an angle relative said user control module.

27. The portable computer according to claim 18, wherein said CPU module includes an input/output interfacing area through which external devices are connectable, said area includes a plurality of openings for facilitating a plurality of expansion cards, each of said openings having a surrounding slot housing a gasket, and a metallic plate closing each of said openings, said plate including means for compressing against said gasket thereby shielding said openings from EMI and moisture intrusion.

28. The portable computer according to claim 18 wherein said disk drive assembly includes:
an enclosure having an indent formed between extended edges to form a channel along at least one of two sides;
a housing having a protruding portion to slidingly mate with said channel of said enclosure;
a lock and a clamp disposed in a cavity formed by the mating of said protruding portion of said housing and said channel of said enclosure, said lock having a first and second selectable position whereby when said lock is in said first position, said clamp is contacted against said enclosure, thereby retaining said enclosure in said housing.

29. The portable computer according to claim 18, further including a vibration isolator, said isolator comprising:
energy absorbing material adapted to absorb vibration energy; and
a rigid plate mounted upon said energy absorbing material and removably supporting a computer unit, said rigid plate further being adapted to cooperate with said energy absorbing material to substantially prevent said energy from damaging said computer unit.

30. The portable computer according to claim 29, wherein said energy absorbing material includes a plurality of holes.

31. A portable computer according to claim 18, further including a fan assembly having means for sensing airflow through said fan and means for adjusting fan speed in accordance with preselected temperature settings.

32. The portable computer according to claim 18, further including an air plenum heatsink having an opening center area surrounded by an outer heat conductive medium, said medium for passing heat to said open center area and allowing airflow through said open center area whereby heat transferred thereto is removed via said airflow.

33. The portable computer according to claim 32, further including heat conductive material disposed on said outer heat conductive medium of said air plenum heatsink for improving heat transfer to said open center area.

* * * * *